(12) United States Patent
Barany et al.

(10) Patent No.: US 12,199,690 B2
(45) Date of Patent: *Jan. 14, 2025

(54) CABLE NETWORK SYSTEM FOR BIDIRECTIONAL COMMUNICATION AT AN ENHANCED DUPLEX FREQUENCY RANGE

(71) Applicant: PPC BROADBAND, INC., East Syracuse, NY (US)

(72) Inventors: David A. Barany, Syracuse, NY (US); Noah Montena, Syracuse, NY (US)

(73) Assignee: PPC BROADBAND, INC., East Syracuse, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/378,179

(22) Filed: Oct. 10, 2023

(65) Prior Publication Data

US 2024/0039578 A1 Feb. 1, 2024

Related U.S. Application Data

(63) Continuation of application No. 17/743,798, filed on May 13, 2022, now Pat. No. 11,817,915.

(Continued)

(51) Int. Cl.
*H04B 3/38* (2006.01)
*H03F 1/02* (2006.01)
(Continued)

(52) U.S. Cl.
CPC ............... *H04B 3/38* (2013.01); *H03F 1/02* (2013.01); *H04B 3/08* (2013.01); *H04L 5/14* (2013.01)

(58) Field of Classification Search
CPC .... H04B 3/38; H04B 3/08; H03F 1/02; H03F 2200/63; H03F 3/62; H04L 5/14
See application file for complete search history.

(56) References Cited

U.S. PATENT DOCUMENTS 9,402,106 B1 7/2016 Harris et al.
10,749,551 B1 8/2020 Finkelstein
(Continued)

OTHER PUBLICATIONS

International Search Report and Written Opinion mailed Sep. 23, 2022 in corresponding International Application No. PCT/US2022/029184, 6 pages.

(Continued)

*Primary Examiner* — Harry H Kim
(74) *Attorney, Agent, or Firm* — MH2 Technology Law Group, LLP

(57) ABSTRACT

A cable network system for bidirectionally communicating signals at an enhanced duplex frequency range, which may be between about 5 MHz and about 650 MHz. This system may include a first amplifier, which may be configured to condition an upstream signal proceeding from a subscriber premises to a headend, without necessarily conditioning a downstream signal proceeding from the headend to the subscriber premises, a second amplifier, which may be configured to condition the downstream signal without necessarily conditioning the upstream signal, and a shaping circuit, which may condition the upstream and downstream signals. This system also may simultaneously, or in an overlapping or offset manner, communicate signals at a full duplex frequency range without a diplex filter.

27 Claims, 4 Drawing Sheets

Related U.S. Application Data

(60) Provisional application No. 63/188,078, filed on May 13, 2021.

(51) Int. Cl.
 H03F 3/62 (2006.01)
 H04B 3/08 (2006.01)
 H04L 5/14 (2006.01)

(56) References Cited

U.S. PATENT DOCUMENTS

| | | | |
|---|---|---|---|
| 11,553,244 B2 | 1/2023 | Maricevic et al. | |
| 2009/0046593 A1 | 2/2009 | Ptasinski et al. | |
| 2016/0013855 A1 | 1/2016 | Campos et al. | |
| 2019/0132111 A1* | 5/2019 | Hamzeh | H04B 3/00 |
| 2019/0222801 A1 | 7/2019 | Barany et al. | |
| 2019/0313132 A1 | 10/2019 | Schemmann et al. | |
| 2019/0320134 A1* | 10/2019 | Barany | H04N 7/17309 |
| 2019/0386700 A1 | 12/2019 | Chapman et al. | |
| 2020/0059206 A1* | 2/2020 | Williams | H04L 5/14 |
| 2020/0112422 A1 | 4/2020 | Domanovitz | |
| 2020/0260153 A1* | 8/2020 | Li | H04N 7/104 |
| 2020/0287626 A1* | 9/2020 | Bowler | H02H 9/044 |
| 2023/0144817 A1* | 5/2023 | Hewavithana | H04B 3/38 455/400 |
| 2023/0283242 A1* | 9/2023 | Rijssemus | H03F 1/26 330/124 R |

OTHER PUBLICATIONS

Prasad et al., "Full-Duplex Power Line Communications: Design and Applications from Multimedia to Smart Grid", IEEE, Feb. 2020, retrieved on [Aug. 31, 2022]. Retrieved from the internet <URL: https://ieeexplore.ieee.org/stamp/stamp.jsp?tp=&arnumber=8910633> entire document.

* cited by examiner

CABLE NETWORK SYSTEM FOR BIDIRECTIONAL COMMUNICATION AT AN ENHANCED DUPLEX FREQUENCY RANGE

CROSS-REFERENCE TO RELATED APPLICATION

This application is a continuation of and claims priority to U.S. application Ser. No. 17/743,798, filed May 13, 2022, and claims priority to U.S. Provisional Patent Application No. 63/188,078, filed on May 13, 2021, the disclosure of which is incorporated herein by reference in its entirety.

BACKGROUND

In cable television and data networks, signals are transmitted downstream (forward) from a signal source, such as a headend, to a subscriber premises and upstream (return) back to the headend. Various signal conditioning components may be provided as part of the network to direct, split, amplify, or otherwise modulate the signals. For example, an amplifier device may increase a signal's power or strength to improve the signal quality in transmission. Further, configurable amplifier devices may be used to amplify either or both of the forward and return radio frequency (RF) signals in the network. These amplifiers may include frequency-based (e.g., diplex) filters to separate the forward or downstream signal path from the return or upstream signal path. The use of diplex filters dedicates the amplifiers to a particular band split (e.g., a discrete forward and discrete return band configuration).

Some networks may implement enhance or full duplex communications. In such communication, the frequencies from 5 Megahertz (MHz) to about 650 MHz may be used bidirectionally for both forward and return signals. That is, in a full-duplex system, both parties can communicate with each other simultaneously, or in an overlapping or offset manner, at the same frequency ranges.

SUMMARY

In some embodiments, a system includes a first amplifier configured to condition an upstream signal proceeding from a subscriber premises to a headend, and configured not to condition a downstream signal proceeding from the headend to the subscriber premises, a second amplifier connected in series to the first amplifier, wherein the second amplifier is configured to condition the downstream signal and is configured to not condition the upstream signal, and a shaping module connected in series to the first amplifier and the second amplifier, wherein the shaping module is configured to condition the upstream signal and to condition the downstream signal, and wherein the first amplifier and the second amplifier are configured to enable bidirectional communication of signals using a full duplex frequency range.

In some embodiments, the bidirectional communication of signals using a full duplex frequency range may be non-simultaneous or the signals may be offset from each other, such as having a different start and/or end time. In some embodiments, the bidirectional communication of signals using an enhanced duplex frequency range may be simultaneous, or in an overlapping or offset manner.

In some embodiments, the first amplifier and the second amplifier are configured to enable simultaneous bidirectional communication of signals using the full duplex frequency range by not including a diplex filter, and the enhanced duplex frequency range may comprise a frequency range of from approximately 5 MHz to approximately 650 MHz.

In some embodiments, an amplifier device includes a first port configured to receive a signal, a first splitter comprising a common port configured to receive the signal from the first port and configured to split the signal into first and second portions, pass the first portion of the signal to an amplification path via a first leg, and pass the second portion of the signal to a non-amplification path via a second leg, a first shaping circuit in the amplification path connected to the first splitter via the first leg of the first splitter and configured to condition the first portion of the signal, an amplifier in the amplification path connected to the first shaping circuit and configured to amplify the first portion of the signal after passing through the first shaping circuit, a second shaping circuit in the amplification path connected to the amplifier and configured to condition the first portion of the signal after passing through the amplifier, a second splitter comprising: a first leg connected to first leg of the first splitter via the amplification path and configured to receive the first portion of the signal after passing through the second shaping circuit, a second leg connected to second leg of the first splitter via the non-amplification path and configured to receive the second portion of the signal, and a common port configured to transmit a combination of the first portion of the signal and the second portion of the signal, and a second port connected to the common port of the second splitter and configured to receive the combination of the first portion of the signal and the second portion of the signal from the common port of the second splitter, wherein the amplifier device is configured to enable simultaneous bidirectional communication of signals using a full duplex frequency range.

In some embodiments, the amplifier device is configured to enable simultaneous bidirectional communication of signals using the full duplex frequency range by not including a diplex filter, and wherein the enhanced duplex frequency range comprises a frequency range of from approximately 5 MHz to approximately 650 MHz.

In some embodiments, a system includes a first amplifier device comprising: a first port configured to receive a first signal transmitted in a first direction, a power supply configured to supply a voltage to the first amplifier device, a first inductor configured to block alternating current (AC) from the power source and pass direct current (DC), a second inductor configured to block a high-frequency portion of the first signal and pass a low-frequency portion of the first signal, a first splitter having a common port, a first leg, and a second leg, the first splitter configured to receive the first signal via the common port of the first splitter, a first shaping circuit connected to the first leg of the first splitter and configured to receive the first signal and equalize the first signal, an amplifier connected to the first shaping circuit and configured to receive and amplify the first signal after the first shaping circuit equalizes the first signal to form an amplified first signal, a second shaping circuit connected to the amplifier and configured to receive the amplified first signal after amplification by the amplifier and configured to form a tilt to the amplified first signal, a second splitter having a first leg, a second leg, and a common port, the second splitter configured to receive the amplified first signal via the first leg of the second splitter after passing through the second shaping circuit and configured to transmit the amplified first signal via the common port, a second port connected to the common port of the second splitter and configured to receive the amplified first signal via the common port and transmit the amplified first signal after the first signal passes through the first shaping circuit, the amplifier, and the second shaping circuit, wherein the first amplifier device is configured to: receive a second signal transmitted in a second direction via the second port, transmit the second signal to the common port of the second splitter, transmit the second signal to the second leg of the first splitter via the second leg of the second splitter, bypassing the second shaping circuit, the amplifier, and the first shaping circuit, and transmit the second signal to the first port via the common port of the first splitter, wherein the second signal is non-amplified after being transmitted to the first port, a second amplifier device comprising: a second port configured to receive the second signal transmitted in the second direction, a power supply configured to supply a voltage to the second amplifier device, a first inductor configured to block AC from the power supply and configured to pass direct DC, a second inductor configured to block a high-frequency portion of the second signal and configured to pass a low-frequency portion of the second signal, a second splitter having a common port, a first leg, and a second leg, the second splitter configured to receive the second signal via the common port of the second splitter, a second shaping circuit connected to the second splitter via the first leg of the second splitter and configured to receive the second signal and to equalize the second signal, an amplifier connected to the first shaping circuit and configured to receive and amplify the second signal after the first shaping circuit equalizes the second signal to form an amplified second signal, a second shaping circuit connected to the amplifier and configured to receive the amplified second signal after amplification by the amplifier and configured to apply a tilt to the amplified second signal, a first splitter having a first leg, a second leg, and a common port, the first splitter configured to receive the amplified second signal via the first leg of the first splitter after passing through the second shaping circuit and configured to transmit the amplified second signal via the common port, and a first port connected to the common port of the first splitter and configured to receive the amplified second signal via the common port and transmit the amplified second signal after the second signal passes through the first shaping circuit, the amplifier, and the second shaping circuit, wherein the second amplifier device is further configured to: receive the first signal transmitted in the first direction via the first port, transmit the first signal to the common port of the first splitter, transmit the first signal to the second leg of the second splitter via the second leg of the first splitter, bypassing the second shaping circuit, the amplifier, and the first shaping circuit of the second amplifier device, and transmit the first signal to the second port via the common port of the second splitter, wherein the first signal is non-amplified by the second amplifier device after being transmitted to the second port, and a shaping module comprising: a first port configured to receive the first signal, a second port configured to receive the second signal, an inductor configured to block high-frequency portions of the first and second signals, and a shaping circuit configured to transmit the first signal through the second port after passing through the shaping circuit and configured to transmit the second signal through the first port after passing through the shaping circuit, wherein the first amplifier device and the second amplifier device are configured to enable simultaneous, or in an overlapping or offset manner, bidirectional communication of signals using a full or enhanced duplex frequency range.

The first amplifier and the second amplifier are configured to enable simultaneous bidirectional communication of signals using the full duplex frequency range by not including a diplex filter, and the full duplex frequency range may comprise a frequency range of from approximately 5 MHz to approximately 650 MHz.

DETAILED DESCRIPTION

Figure 1:
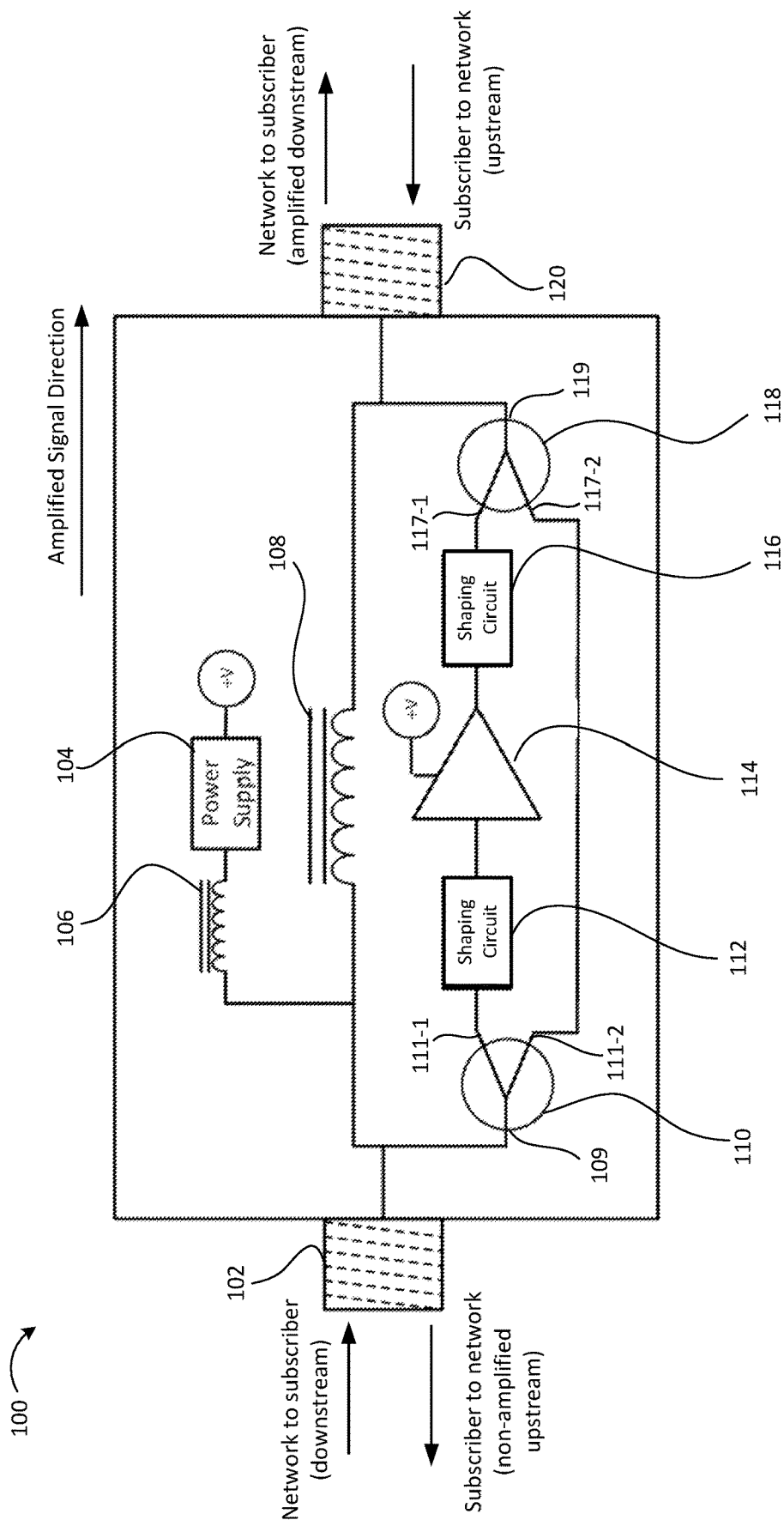
FIG. 1 illustrates an example downstream modular amplifier device for amplifying signals in a downstream direction in accordance with aspects of the present disclosure.

Amplifiers used in a cable network may include diplex filters or other devices to separate a forward or downstream signal path from a return or upstream signal path, which may limit network flexibility and bandwidth. To increase the data rate from the subscriber to the cable operator, generally the bandwidth of the return band is also increased. To accomplish this increase in bandwidth of the return band, generally either the diplex filters in an amplifier are changed or replaced or the amplifier itself is changed or replaced. The diplex filters also prevent the use of bandwidth expanding "Full Duplex" technology. In a full-duplex system a frequency band is used for simultaneous, bidirectional signal transmission. In a specific embodiment, the frequency band range may be a "full duplex frequency range" which may be a frequency range of from approximately 5 MHz to approximately 650 MHz, although the upper end of the frequency range could be adjusted upwards or downwards from the 650 MHz, such as 600 MHz or 750 MHz, for example. Traditional amplifiers also typically have amplification in both the forward and return paths, even when amplification in the forward or return path is not required. Additionally, these amplifiers may require plug-in components to shape the RF spectrum.

Embodiments disclosed herein enable bidirectional transmission of signals utilizing a full duplex frequency range, which may be a frequency range of from approximately 5 MHz to approximately 650 MHz. In some embodiments, the bidirectional transmission of signals utilizing a full duplex frequency range may be enabled to occur in a simultaneous manner, or in an overlapping or offset manner, as opposed to only being able to sending bidirectional signals one at a time. In some embodiments, the bidirectional transmission of signals utilizing a full duplex frequency range may be enabled to occur in a non-simultaneous manner. In some embodiments, the bidirectional transmission of signals utilizing a full or "enhanced" duplex frequency range may be enabled to occur in an offset manner.

Accordingly, aspects of the present disclosure may include a wideband, modular amplifier device that uses splitters with high port-to-port isolation to prevent open loop gain oscillation. In some embodiments, the amplifier may be configured such that the gain of the amplifier may be less than the port-to-port isolation of the splitters to prevent the open loop gain oscillation. In some embodiments, the modular amplifier devices may not include diplexers. The elimination of the diplex filters allows the modular amplifier device, in accordance with aspects of the present disclosure, to be used in any band split, e.g., without modification. In some embodiments, the elimination of the diplex filters allows the modular amplifier device to be used in "Full Duplex" operation, even when multiple amplifier devices are connected together in series.

In some embodiments, aspects of the present disclosure may include separate forward and return modular amplifier devices. As such, the modular amplifier devices may be co-located or located remotely from one another, depending, for example, on amplification requirements at different locations in the network. Further, the modular amplifier devices may be relatively physically small and modular and thus may potentially be placed in any location in the network.

In some embodiments, a modular amplifier device (e.g., either forward or return module) may be contained in enclosures in which the modular amplifier device may include plug-in or removable components disposed prior to the a gain stage of the modular amplifier device. In a specific embodiment, the enclosures may be die-cast. In some embodiments, the amplifier may include one or more plug-in components to control flat loss, offset cable equalization and/or shape the RF spectrum prior to amplification (e.g., such that a flat signal is provided to an amplification component to minimize the amplification of noise). In some embodiments, an additional plug-in component may be provided after the amplifiers gain stage to create "output tilt" in which relatively low frequencies may have more attenuation than the higher frequencies to precondition the RF spectrum prior to downstream transmission through an RF cable. This preconditioning may offset the higher frequency attenuation of the RF spectrum as the signals travel down the cable. For example, by providing the "output tilt" in which the higher frequencies are transmitted at a higher power, the length of the cable itself may naturally attenuate the higher power of the high frequency signals such that the power levels at all frequencies are equalized by the cable prior to reaching the next component of the network. In some embodiments, the plug-in components may be configured to be replaceable with different plug-in components having different attenuation and/or equalization behaviors, e.g., as conditions of the cable network change over time. Thus, the signal shaping behavior (e.g., attenuation and/or equalization behavior) of the modular amplifier device, described herein, may be adapted.

In some embodiments, separate forward and return modular amplifier devices may be provided with preselected built-in components instead of or in addition to the plug-in components. In some embodiments, the amplifier device may be sealed within its housing. That is, in some embodiments, the modular amplifier device may be provided as a non-serviceable device. In this implementation, different modular amplifier devices with different preconfigured attenuation and/or equalizations may be provided for improved amplification flexibility, depending on the characteristics of the network at different locations. As such, amplifier devices with different attenuation and equalization behaviors may be used at different points in the network depending on the physical characteristics of the network at different locations. Further, the use of preconfigured amplifier modules may minimize installation errors and reduce cost by avoiding configuration errors in the field.

In some embodiments, aspects of the present disclosure may also include a separate signal shaping module for situations in which additional signal shaping may be needed (e.g., to supplement or adjust the signal shaping provided by the pre-configured modular amplifier devices). These signal shaping modules may be passive elements that can be added either before or after a module amplifier device. As such, reliability may be enhanced as the modular amplifier device may be hermetically sealed, thereby protecting the modular amplifier device from environmental elements. Moreover, serviceability may be improved as modules can be quickly and easily swapped out in the field.

Reference will now be made in detail to embodiments, examples of which are illustrated in the accompanying drawings and figures. In the following detailed description, numerous specific details are set forth in order to provide a thorough understanding of the various embodiments of the invention. However, it will be apparent to one of ordinary skill in the art that the invention may be practiced without these specific details. In other instances, well-known methods, procedures, components, circuits, and networks have not been described in detail so as not to unnecessarily obscure aspects of the embodiments.

FIG. 1 illustrates an example upstream modular amplifier device 100 for amplifying signals in an upstream direction in accordance with aspects of the present disclosure. The upstream modular amplifier device 100 may include a first port 102, a power supply 104, a first inductor 106, a second inductor 108, a first splitter 110, a first shaping circuit 112, an amplifier 114, a second shaping current 116, a second splitter 118, and a second port 120.

The first port 102 may connect to the first splitter 110 and to the second port 120 via the second inductor 108. The first splitter 110 may include a first leg 111-1 and a second leg 111-2. The first leg 111-1 connects to the first shaping circuit 112 and the second leg 111-2 connects to a second leg 117-2 of the second splitter 118. The first shaping circuit 112 may connect to the amplifier 114, and the amplifier 114 may connect to the second shaping circuit 116. The second shaping circuit 116 may connect to a first leg 117-1 of the second splitter 118. A common port 119 of the second splitter 118 may connect to the second port 120.

In some embodiments, the power supply 104 may provide a voltage (V+) which may pass through the first inductor 106, thus blocking high-frequency alternating current (AC) while allowing low-frequency direct current (DC) to pass and regulating the voltage V+. The second inductor 108 may block high-frequency signals received through the first port 102 and the second port 120. In some embodiments, the first inductor 106 and the second inductor 108 may be choke inductors.

As shown in FIG. 1, the upstream modular amplifier device 100 may be configured to amplify signals transmitted in a downstream direction (e.g., from a network provider to a subscriber) and to transmit non-amplified signals in the upstream direction (e.g., from the subscriber to the network provider) as shown. As described herein, the amplified downstream path (e.g., from the network provider to the subscriber) is the path from the first port 102, the first leg 111-1 of the first splitter 110, the first shaping circuit 112, the amplifier 114, the second shaping circuit 116, the first leg 117-1 of the second splitter 118, and the second port 120. The non-amplified upstream path (e.g., from the subscriber to the network provider) is the path from the second port 120, the second leg 117-2 of the second splitter 118 to the second leg 111-2 of the first splitter 110, bypassing the second shaping circuit 116, the amplifier 114, and first shaping circuit 112, to the first port 102.

In some embodiments, a downstream signal may be received through the first port 102. The second inductor 108 may block a high-frequency portion of the signal upon entry of the signal through the first port 102. The first splitter 110 may receive the low-frequency portion of the signal via a common port 109, may split the signal, and transmit the first portion of the split signal via the first leg 111-1 and a second portion of the split signal via the second leg 111-2. The first shaping circuit 112 may receive the signal via the first leg 111-1 and condition the signal prior to the signal reaching the amplifier 114. For example, the first shaping circuit 112 may shape the signal by providing a "negative tilt" by attenuating higher frequencies such that the power of the higher frequencies is lower than the power of the lower frequencies. In this way, the signal is equalized or "flattened" prior to reaching the amplifier 114. In some embodiments, the level of tilt or attenuation provided by the first shaping circuit 112 may be configured based on the conditions of the network and/or cabling at the point in which the modular amplifier device 100 is placed. For example, network components in the network (e.g., cabling or other components) may naturally attenuate high frequency signals to a certain degree depending on the characteristics of the network components (e.g., length of the cable, properties of the cable, etc.). The level of tilt or attenuation provided by the first shaping circuit 112 may be based on the degree to which the network components naturally attenuate the high frequency signals such that the first shaping circuit 112 properly equalizes the signal prior to the signal reaching the amplifier 114.

After the signal passes through the first shaping circuit 112, the amplifier 114 may receive and amplify the signal by applying the voltage V+ to the signal. The amplified signal may be received by the second shaping circuit 116 which may precondition the signal at the post-amplification stage. For example, the second shaping circuit 116 may create an "output tilt" in which the low frequencies are attenuated greater than the higher frequencies to precondition the RF spectrum prior to transmission of the signal down an RF cable. This preconditioning may offset the higher frequency attenuation of the RF spectrum as the signal travels in the coaxial cable. As further shown in FIG. 1, the amplified downstream signal may be transmitted through the second port 120 via the second splitter 118. For example, the second splitter 118 may receive the amplified downstream signal via the first leg 117-1 of the second splitter 118 and transmit the amplified downstream signal via a common port 119 of the second splitter 118.

In some embodiments, the second splitter 118 of the modular amplifier device 100 may receive an upstream signal through the common port 119 via the second port 120. The upstream signal may be transmitted through the second leg 117-2 of the second splitter 118 to the first splitter 110 via the second leg 111-2 of the first splitter 110, thereby bypassing the second shaping circuit 116, the amplifier 114, and the first shaping circuit 112. In this way, the upstream signal may not be amplified. The non-amplified upstream signal may be transmitted through the first port 102 via the common port 109 of the first splitter 110.

In some embodiments, the first shaping circuit 112 and the second shaping circuit 116 may be plug-in components that may be reprogramed (e.g., by an external device that plugs into the first shaping circuit 112 and/or the second shaping circuit 116) or switched out to modify the attenuation and/or equalization behaviors and configurations of the first shaping circuit 112 and/or the second shaping circuit 116. In this way, the first shaping circuit 112 and/or the second shaping circuit 116 may be reprogrammed or changed as needed to modify the attenuation and equalization behaviors of the modular amplifier device 100. In an alternative embodiment, the first shaping circuit 112 and the second shaping circuit 116 may be fixed or non-plug-in components with preconfigured shaping, attenuation, and equalization algorithms. Thus, the modular amplifier device 100 may be hermetically sealed to prevent damage and increase device longevity. As further described herein, a shaping module may be provided to adjust the shaping, attenuation, and equalization before or after the amplification as needed.

Figure 2:
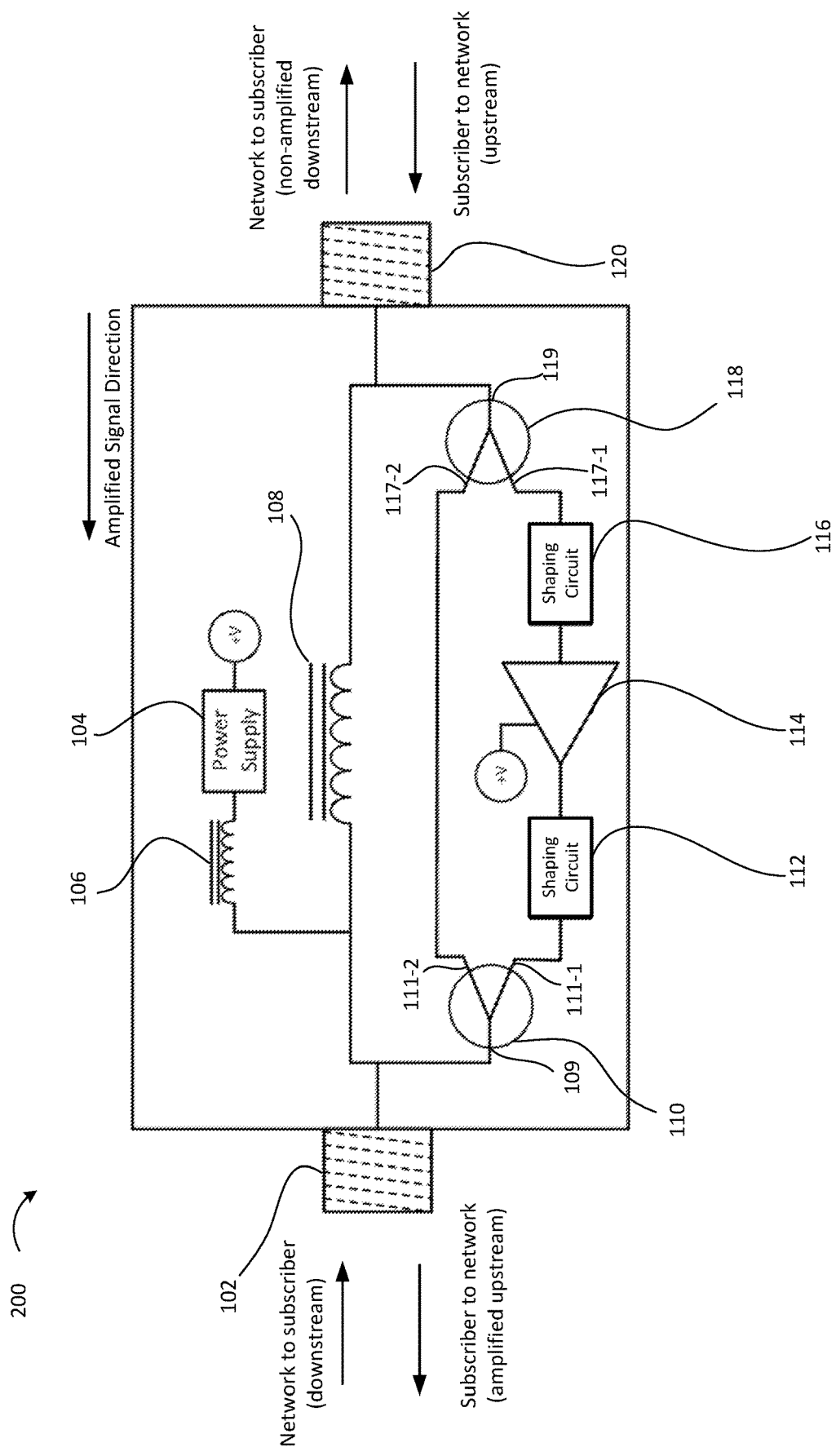
FIG. 2 illustrates an example upstream modular amplifier device for amplifying signals in an upstream direction in accordance with aspects of the present disclosure.

FIG. 2 illustrates an example upstream modular amplifier device 200 for amplifying signals in an upstream direction in accordance with aspects of the present disclosure. As shown in FIG. 2, the modular amplifier device 200 may include similar components and connections as the modular amplifier device 100 shown in FIG. 1. In some embodiments, the modular amplifier device 200 may be configured to amplify signals in the upstream direction (e.g., from the subscriber to the network). As described herein, the amplified upstream path is the path from the second port 120, the second splitter 118, the second shaping circuit 116, the amplifier 114, the first shaping circuit 112, the first splitter 110, and the first port 102. The non-amplified downstream path is the path from the first port 102, the first splitter 110 to the second splitter 118, bypassing the first shaping circuit 112, the amplifier 114, and the second shaping circuit 116, to the second port 120.

In some embodiments, an upstream signal may be received through the second port 120. The second inductor 108 may block a high-frequency portion of the signal upon entry of the signal through the second port 120. The second splitter 118 may receive the low-frequency portion of the signal via the common port 119, may split the signal, and transmit a first portion of the split signal via the first leg 117-1 and a second portion of the split signal via the second leg 117-2 of the second splitter 118. The second shaping circuit 116 may receive the signal via the first leg 117-1 and condition the signal prior to the signal reaching the amplifier 114. For example, the second shaping circuit 116 may shape the signal by providing a "negative tilt" and attenuating higher frequencies such that the power of the higher frequencies is lower than the power of the lower frequencies. In this way, the signal is equalized or "flattened" prior to reaching the amplifier 114. After the signal passes through the second shaping circuit 116, the amplifier 114 may receive and amplify the signal by applying the voltage V+ to the signal. The amplified signal may be received by the first shaping circuit 112 which may precondition the amplified signal at the post-amplification stage. For example, the first shaping circuit 112 may create an "output tilt" in which the low frequencies are attenuated greater than the higher frequencies to precondition the RF spectrum prior to transmission of the signal down an RF cable. As further shown in FIG. 2, the amplified upstream signal may be transmitted through the first port 102 via the first splitter 110. For example, the first splitter 110 may receive the amplified upstream signal via the first leg 111-1 of the first splitter 110 and transmit the amplified upstream signal via a common port 109 of the first splitter 110.

In some embodiments, the second splitter 118 of the modular amplifier device 200 may receive a downstream signal through the common port 109 via the first port 102. The downstream signal may be transmitted through the second leg 111-2 of the first splitter 110 to the second splitter 118 via the second leg 117-2 of the second splitter 118, thereby bypassing the first shaping circuit 112, the amplifier 114, and second shaping circuit 116. In this way, the downstream signal may not be amplified. The non-amplified downstream signal may be transmitted through the second port 120 via the common port 119 of the second splitter 118.

As described herein, the modular amplifier device 100 and the modular amplifier device 200 may be installed at any location in a cable network in which signal amplification is desired. Further, since the modular amplifier device 100 and modular amplifier device 200 amplify signals traveling in different directions, the modular amplifier device 100 and modular amplifier device 200 provide flexible signal amplification options in which the modular amplifier device 100 may be installed in a location in which downstream amplification is desired and the modular amplifier device 200 may be installed in a location in which upstream amplification is desired. In this way, unnecessary amplification is avoided, thus reducing instances in which noise is amplified in a signal that did not need amplification.

As previously discussed, the first shaping circuit 112 and/or the second shaping circuit 116 of the modular amplifier device 200 may be plug-in components in which a programming device may connect to reprogram the shaping, attenuation, and/or equalization algorithms of the first shaping circuit 112 and/or the second shaping circuit 116. Alternatively, the first shaping circuit 112 and the second shaping circuit 116 may be fixed or non-plug-in components with preconfigured shaping, attenuation, and equalization algorithms such that modular amplifier device 100 and/or the modular amplifier device 200 may be sealed, improving durability and longevity and eliminating the need for configuration of the first shaping circuit 112 and/or the second shaping circuit 116. As described herein, aspects of the present disclosure may include a shaping module having a shaping circuit to provide additional shaping (e.g., effectively modifying the shaping, attenuation, and/or equalization provided by the first shaping circuit 112 and/or the second shaping circuit 116).

Figure 3:
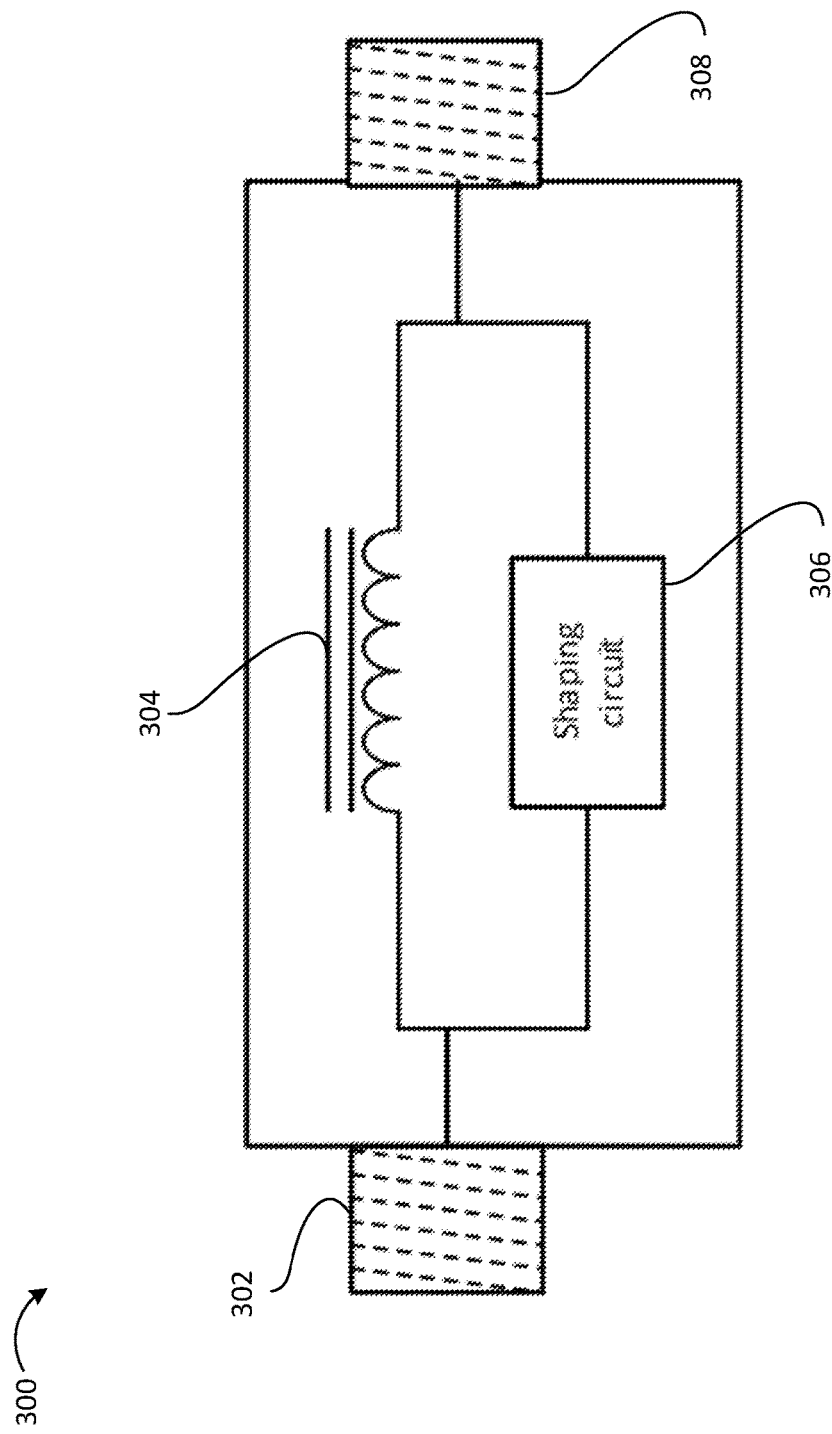
FIG. 3 illustrates an example of a shaping module in accordance with aspects of the present disclosure.

FIG. 3 illustrates an example of a shaping module in accordance with aspects of the present disclosure. As shown in FIG. 3, the signal shaping module 300 may include a first port 302, an inductor 304, a shaping circuit 306, and a second port 308. As described herein, the input and output of the shaping module 300 may be connected in a serial arrangement and the signal shaping module 300 may be provided at any point in a network in which signal shaping may be desired. The inductor 304 may block high-frequency portions of the signal received through the first port 302 and/or the second port 308. The shaping module 300 may provide additional shaping, attenuation, tilting, and/or equalization, thereby effectively modifying the shaping provided by the first shaping circuit 112 and/or the second shaping circuit 116 of the first and/or modular amplifier devices 100, 200 if additionally provided. In some embodiments, the shaping module 300 may receive a signal through the first port 302 and/or the second port 308 (e.g., an amplified or unamplified signal). The inductor 304 may block high-frequency signals received through the first port 302 and/or the second port 308. The low-frequency signals may be passed through the shaping circuit 306, which may condition the signals using a preconfigured shaping algorithm. Different shaping modules 300 may implement different shaping circuits 306 programmed with different shaping algorithms. Thus, different shaping modules 300 may be selected and installed based on the shaping needs of a signal (e.g., prior to a signal being amplified by the modular amplifier device 100 and/or the modular amplifier device 200, or after the signal is amplified by the modular amplifier device 100 and/or the modular amplifier device 200). In this way, the shaping module 300 may be used in conjunction with the modular amplifier device 100 and/or the modular amplifier device 200 such that reprogramming and reconfiguration of the modular amplifier device 100 and/or the modular amplifier device 200 is not needed. Further, the shaping module 300, in conjunction with the modular amplifier device 100 and/or the modular amplifier device 200, may provide a modular system in which signal amplification and shaping may be provided as needed at any location in the network.

Figure 4:
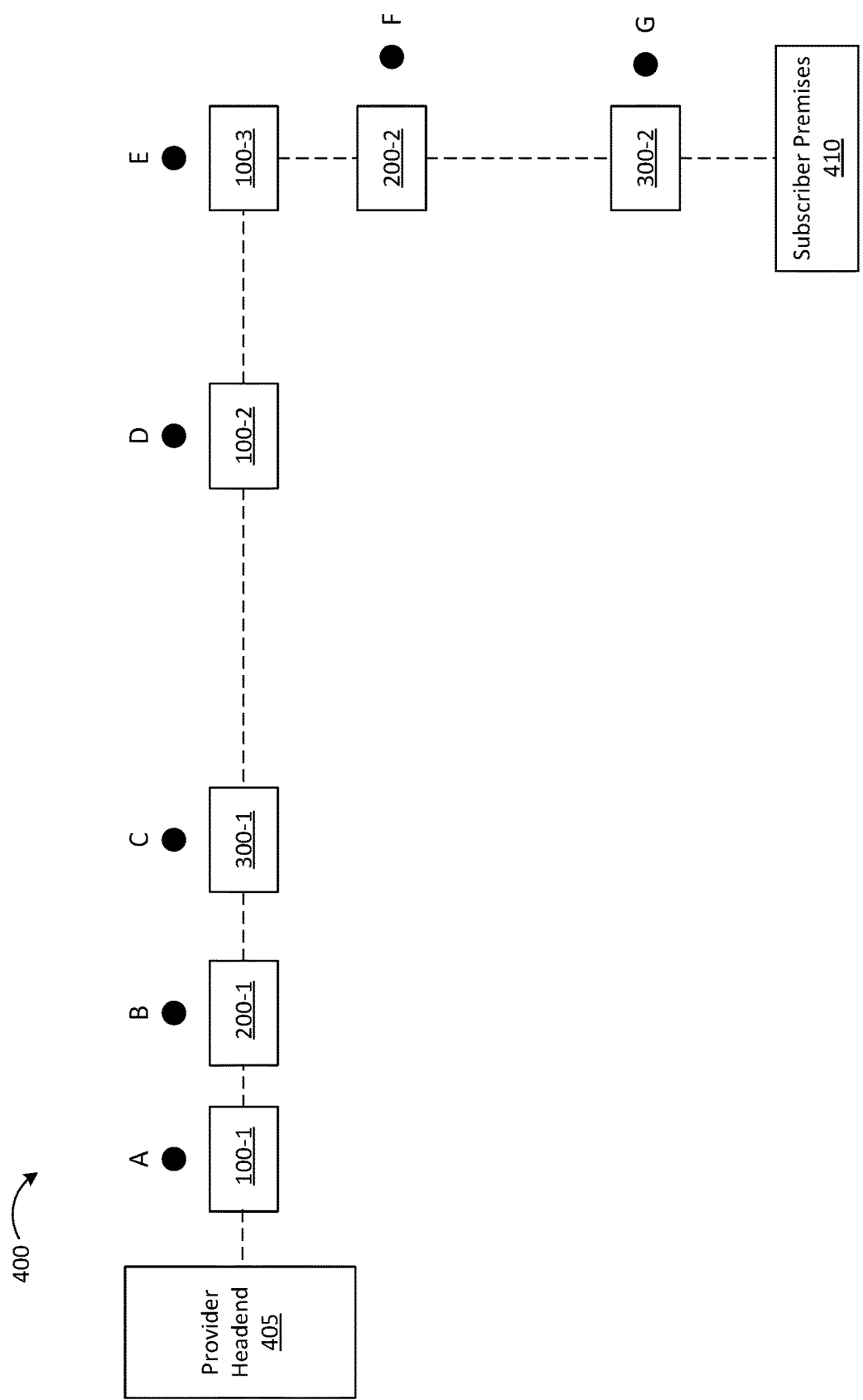
FIG. 4 illustrates an example network that includes one or more upstream modular amplifier devices, downstream modular amplifier devices, and shaping modules at different points in the network in accordance with aspects of the present disclosure.

FIG. 4 illustrates an example network that includes one or more downstream modular amplifier devices, upstream modular amplifier devices, and shaping modules at different points in the network in accordance with aspects of the present disclosure. As shown in FIG. 4, a network 400 (e.g., a cable network) may include a provider headend 405, a first modular amplifier device 100-1 (e.g., at point A), a first modular amplifier device 200-1 (e.g., at point B), a first shaping module 300-1 (e.g., at point C), a second modular amplifier device 100-2 (e.g., at point D), a third modular amplifier device 100-3 (e.g., at point E), a second modular amplifier device 200-2 (e.g., at point F), a second shaping module 300-2 (e.g., at point G), and a subscriber premises 410. As illustrated in the example of FIG. 4, downstream modular amplifier devices 100, upstream modular amplifier devices 200, and shaping modules 300 may be placed at network locations between the provider headend 405 and the subscriber premises 410 in which amplification and/or shaping is needed based on network conditions and performance at those locations (e.g., as determined by network testing and maintenance procedures). Accordingly, the modular amplifier devices 100, modular amplifier devices 200, and/or shaping modules 300 may provide a modular system in which signal amplification and shaping may be provided as needed at any location in the network 400. It is noted that the arrangement of the devices shown in FIG. 4 is merely one example for illustrative and explanatory purposes, and in practice, the network 400 may include additional, fewer, or differently arranged components than what is shown in FIG. 4.

The foregoing description provides illustration and description but is not intended to be exhaustive or to limit the possible implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of the possible implementations. In fact, many of these features may be combined in ways not specifically recited in the claims and/or disclosed in the specification. Although each dependent claim listed below may directly depend on only one other claim, the disclosure of the possible implementations includes each dependent claim in combination with every other claim in the claim set.

While the present disclosure has been disclosed with respect to a limited number of embodiments, those skilled in the art, having the benefit of this disclosure, will appreciate numerous modifications and variations there from. For example, some components, described as being separate pieces or parts, may be integrated into one component. Similarly, one component may be divided into one or more sub-components, pieces, or parts. It is intended that the appended claims cover such modifications and variations as fall within the true spirit and scope of the disclosure.

No element, act, or instruction used in the present application should be construed as critical or essential unless explicitly described as such. Also, as used herein, the article "a" is intended to include one or more items and may be used interchangeably with "one or more." Where only one item is intended, the term "one" or similar language is used. Further, the terms "first" and "second" may be used interchangeably. For example, an element described as a "first" element may also be considered a "second" element and vice versa.

What is claimed is:

1. A cable network system for simultaneously and bidirectionally communicating signals at an enhanced duplex frequency range comprising:
a first amplifier device comprising:
a first port configured to receive a first signal transmitted in a first direction;
a first splitter having a common port, a first leg, and a second leg, the first splitter configured to receive the first signal via the common port of the first splitter;
a first shaping circuit connected to the first leg of the first splitter and configured to receive the first signal and equalize the first signal;
an amplifier connected to the first shaping circuit and configured to receive and amplify the first signal after the first shaping circuit equalizes the first signal to form an amplified first signal;
a second shaping circuit connected to the amplifier and configured to receive the amplified first signal after amplification by the amplifier and configured to form a tilt to the amplified first signal;
a second splitter having a first leg, a second leg, and a common port, the second splitter configured to receive the amplified first signal via the first leg of the second splitter after passing through the second shaping circuit and configured to transmit the amplified first signal via the common port;
a second port connected to the common port of the second splitter and configured to receive the amplified first signal via the common port and transmit the amplified first signal after the first signal passes through the first shaping circuit, the amplifier, and the second shaping circuit;
wherein the first amplifier device is configured to receive a second signal transmitted in a second direction via the second port, transmit the second signal to the common port of the second splitter; and
to transmit the second signal to the second leg of the first splitter via the second leg of the second splitter, bypassing the second shaping circuit, the amplifier, and the first shaping circuit, and transmit the second signal to the first port via the common port of the first splitter, wherein the second signal is non-amplified after being transmitted to the first port;
a second amplifier device comprising:
a second port configured to receive the second signal transmitted in the second direction;
a second splitter having a common port, a first leg, and a second leg, the second splitter configured to receive the second signal via the common port of the second splitter;
a second shaping circuit connected to the second splitter via the first leg of the second splitter and configured to receive the second signal and to equalize the second signal;
an amplifier connected to the first shaping circuit and configured to receive and amplify the second signal after the first shaping circuit equalizes the second signal to form an amplified second signal;
a second shaping circuit connected to the amplifier and configured to receive the amplified second signal after amplification by the amplifier and configured to apply a tilt to the amplified second signal;
a first splitter having a first leg, a second leg, and a common port, the first splitter configured to receive the amplified second signal via the first leg of the first splitter after passing through the second shaping circuit and configured to transmit the amplified second signal via the common port; and
a first port connected to the common port of the first splitter and configured to receive the amplified second signal via the common port and transmit the amplified second signal after the second signal passes through the first shaping circuit, the amplifier, and the second shaping circuit,
a shaping module comprising:
a first port configured to receive the first signal;
a second port configured to receive the second signal;
a shaping circuit configured to transmit the first signal through the second port after passing through the shaping circuit and configured to transmit the second signal through the first port after passing through the shaping circuit;
wherein the first amplifier device and the second amplifier device are configured to simultaneously and bidirectionally communicate signals at an enhanced duplex frequency range without including a diplex filter;
wherein the second amplifier device is further configured to receive the first signal transmitted in the first direction via the first port, transmit the first signal to the common port of the first splitter, transmit the first signal to the second leg of the second splitter via the second leg of the first splitter, bypassing the second shaping circuit, the amplifier, and the first shaping circuit of the second amplifier device, and transmit the first signal to the second port via the common port of the second splitter, wherein the first signal is non-amplified by the second amplifier device after being transmitted to the second port; band
wherein the enhanced duplex frequency range does not comprise a half-duplex frequency range where bidirectional communication of signals can only take place at a frequency of one bidirectional signal at a time.

2. The system of claim 1 wherein the first amplifier device is configured to amplify the first signal in the first direction and not amplify the second signal in the second direction, and
wherein the second amplifier device is configured to amplify the second signal in the second direction and not amplify the first signal in the first direction.

3. The system of claim 1, wherein the first signal and the second signal are cable network signals.

4. The system of claim 1, wherein the first direction is a downstream direction from a network provider to a subscriber, and the second direction is an upstream direction from the subscriber to the network provider.

5. The system of claim 1, wherein the first shaping circuit and the second shaping circuit of the first amplifier device are plug-in devices configured to be reprogrammable.

6. The system of claim 1,
wherein the enhanced duplex frequency range comprises a frequency range of between about 5 MHz and about 650 MHz; and
wherein the enhanced duplex frequency range comprises a full duplex frequency range.

7. An amplifier device for simultaneously and bidirectionally communicating signals at an enhanced duplex frequency range in a cable network system comprising:
a first splitter that is configured to receive a signal and split the signal into first and second portions, pass the first portion of the signal to an amplification path via a first leg, and pass the second portion of the signal to a non-amplification path via a second leg;
a first shaping circuit located in the amplification path, connected to the first splitter via the first leg of the first splitter, and configured to condition the first portion of the signal;
an amplifier located in the amplification path, connected to the first shaping circuit, and configured to amplify the first portion of the signal when the first portion of the signal passes through the first shaping circuit;
a second shaping circuit located in the amplification path, connected to the amplifier, and configured to condition the first portion of the signal after the first portion of the signal has passed through the amplifier;
a second splitter comprising:
a first leg connected to first leg of the first splitter via the amplification path and configured to receive the first portion of the signal after passing through the second shaping circuit;
a second leg connected to second leg of the first splitter via the non-amplification path and configured to receive the second portion of the signal; and
a common port configured to transmit a combination of the first portion of the signal and the second portion of the signal; and
wherein the amplifier device is configured to simultaneously and bidirectionally communicate signals at an enhanced duplex frequency range; and
wherein the enhanced duplex frequency range does not comprise a half-duplex frequency range where bidirectional communication of signals can only take place at a frequency of one bidirectional signal at a time.

8. The amplifier device of claim 7, wherein the amplification path is a downstream amplification path configured to amplify a signal in a downstream direction.

9. The amplifier device of claim 7, wherein the amplification path is an upstream amplification path configured to amplify a signal in an upstream direction.

10. The amplifier device of claim 7, wherein the amplification path and the non-amplification path are separate and distinct paths.

11. The amplifier device of claim 7, wherein the second leg of the first splitter and the second leg of the second splitter are directly connected and form the non-amplification path bypassing the first shaping circuit, the amplifier, and the second shaping circuit.

12. The amplifier device of claim 7, wherein the enhanced duplex frequency range comprises a frequency range of between about 5 MHz and about 650 MHZ.

13. The amplifier device of claim 7, the enhanced duplex frequency range comprises a full duplex frequency range.

14. The amplifier device of claim 7, wherein the amplifier is configured to simultaneously and bidirectionally communicate signals at the enhanced duplex frequency range without a diplex filter.

15. A cable network system for bidirectionally communicating signals at an enhanced duplex frequency range comprising:
a first amplifier configured to condition an upstream signal, and configured not to condition a downstream signal;
a second amplifier connected in series to the first amplifier, and configured to condition the downstream signal and not condition the upstream signal;
wherein the first amplifier and the second amplifier are configured to bidirectionally communicate signals at an enhanced duplex frequency range; and
wherein the enhanced duplex frequency range does not comprise a half-duplex frequency range where bidirectional communication of signals can only take place at a frequency of one bidirectional signal at a time.

16. The system of claim 15, further comprising a shaping module connected to the first amplifier and the second amplifier, and configured to condition the upstream signal and the downstream signal, wherein the shaping module is positioned upstream of, between, or downstream of the first amplifier and the second amplifier.

17. The system of claim 15, wherein the first amplifier is configured to attenuate a first frequency range of the upstream signal such that a power level of the upstream signal in the first frequency range is lower than a power level of the upstream signal in a second frequency range of the upstream signal, wherein the first frequency range being higher than the second frequency range, and wherein the first amplifier is also configured to amplify the upstream signal after attenuating the first frequency range and pre-condition the signal after amplification by attenuating the second frequency range of the upstream signal that is greater than the first frequency range of the upstream signal.

18. The system of claim 15, wherein the second amplifier is configured to attenuate a first frequency range of the downstream signal such that power level of the first frequency range is lower than a power level of a second frequency range of the downstream signal, the first frequency range being higher than the second frequency range, and wherein the second amplifier is also configured to amplify the downstream signal after attenuating the first frequency range; and pre-condition the signal after amplification by attenuating the second frequency range of the downstream signal greater than the first frequency range of the downstream signal.

19. The system of claim 15, wherein the first amplifier comprises a first shaping circuit and a second shaping circuit that is configured to condition the upstream signal, and wherein the first shaping circuit or the second shaping circuit comprise plug-in modules or non-plug-in components.

20. The system of claim 15, wherein the second amplifier comprises a first shaping circuit and a second shaping circuit that is configured to condition the downstream signal, wherein the first shaping circuit or the second shaping circuit comprise plug-in modules or non-plug-in components.

21. The system of claim 15, wherein the first amplifier, the second amplifier, and the shaping module are configured to be directly connected together or connected together via one or more cables in separate housings.

22. The system of claim 15, wherein the first amplifier comprises:
a first port configured to receive the upstream signal;
a first splitter comprising a common port;
a first leg forming an amplification path via; and
a second leg forming a non-amplification path;

a first shaping circuit in the amplification path connected to the first splitter via the first leg of the first splitter;

an amplification component in the amplification path connected to the first shaping circuit;

a second shaping circuit in the amplification path connected to the amplification component;

a second splitter comprising:

a first leg connected to first leg of the first splitter via the amplification path;

second leg connected to second leg of the first splitter via the non-amplification path;

a common port; and a second port connected to the common port of the second splitter.

23. The system of claim 15, wherein the first amplifier and the second amplifier are configured to bidirectionally communicate signals at the enhanced duplex frequency range in a simultaneous manner.

24. The system of claim 15, wherein the first amplifier and the second amplifier are configured to bidirectionally communicate signals at the enhanced duplex frequency range in an overlapping or offset manner.

25. The system of claim 15, wherein the first amplifier and the second amplifier are configured to simultaneously and bidirectionally communicate signals at the enhanced duplex frequency range without a diplex filter.

26. The system of claim 15, wherein the enhanced duplex frequency range comprises a frequency range of between about 5 MHz and about 650 MHz.

27. The system of claim 15, wherein the enhanced duplex frequency ranges comprises a full duplex frequency range.

* * * * *